(12) United States Patent
Gorman et al.

(10) Patent No.: US 9,224,503 B2
(45) Date of Patent: Dec. 29, 2015

(54) MEMORY TEST WITH IN-LINE ERROR CORRECTION CODE LOGIC

(71) Applicant: INTERNATIONAL BUSINESS MACHINES CORPORATION, Armonk, NY (US)

(72) Inventors: Kevin W. Gorman, Fairfax, VT (US); Michael R. Ouellette, Westford, VT (US); Patrick E. Perry, Shelburne, VT (US)

(73) Assignee: International Business Machines Corporation, Armonk, NY (US)

( * ) Notice: Subject to any disclaimer, the term of this patent is extended or adjusted under 35 U.S.C. 154(b) by 92 days.

(21) Appl. No.: 13/683,154

(22) Filed: Nov. 21, 2012

(65) Prior Publication Data
US 2014/0143619 A1   May 22, 2014

(51) Int. Cl.
*G11C 29/42* (2006.01)
*G11C 29/44* (2006.01)
*G11C 29/36* (2006.01)
*G11C 29/12* (2006.01)

(52) U.S. Cl.
CPC .............. *G11C 29/42* (2013.01); *G11C 29/44* (2013.01); *G11C 29/4401* (2013.01); *G11C 29/12* (2013.01); *G11C 29/36* (2013.01)

(58) Field of Classification Search
CPC ........ G11C 29/56; G11C 29/42; G11C 29/44; G11C 29/12; G11C 29/10; G11C 29/08; G11C 29/04; G11C 29/36; G11C 2029/36; G11C 2029/3602; G06F 11/2215; G06F 11/27; G01R 31/3183
USPC ................................. 714/718, 719, 724, 733
See application file for complete search history.

(56) References Cited

U.S. PATENT DOCUMENTS

| | | | |
|---|---|---|---|
| 6,397,357 B1 | 5/2002 | Cooper | |
| 7,200,780 B2 | 4/2007 | Kushida | |
| 7,308,621 B2 | 12/2007 | Adams et al. | |
| 7,373,583 B2 | 5/2008 | Hummler | |
| 7,779,334 B2 | 8/2010 | Earle et al. | |

(Continued)

FOREIGN PATENT DOCUMENTS

| TW | 222078 | 10/2004 |
|---|---|---|
| WO | 2008078229 | 7/2008 |

OTHER PUBLICATIONS

Su et al., "An Integrated ECC and Redundancy Repair Scheme for Memory Reliability Enhancement", Proceedings of the 2005 20th IEEE International Symposium on Defect and Fault Tolerance in VLSI Systems, IEEE, 2005, pp. 1-9.

(Continued)

*Primary Examiner* — Albert Decady
*Assistant Examiner* — Christian Dorman
(74) *Attorney, Agent, or Firm* — Jennifer Anda; Roberts Mlotkowski Safran & Cole, P.C.

(57) ABSTRACT

Systems and methods are provided for reusing existing test structures and techniques used to test memory data to also test error correction code logic surrounding the memories. A method includes testing a memory of a computing system with an error code correction (ECC) logic block bypassed and a first data pattern applied. The method further includes testing the memory with the ECC logic block enabled and a second data pattern applied. The method also includes testing the memory with the ECC logic block enabled and the first data pattern applied.

20 Claims, 3 Drawing Sheets

(56) References Cited

U.S. PATENT DOCUMENTS

| | | |
|---|---|---|
| 7,908,530 B2 | 3/2011 | Chen |
| 7,996,734 B2 | 8/2011 | Earle et al. |
| 2003/0204795 A1 | 10/2003 | Adams et al. |
| 2004/0210803 A1 | 10/2004 | Cheng et al. |
| 2007/0208977 A1* | 9/2007 | Clark et al. .................. 714/728 |
| 2007/0255981 A1 | 11/2007 | Eto |
| 2008/0229176 A1 | 9/2008 | Arnez et al. |
| 2009/0249148 A1* | 10/2009 | Ito et al. ........................ 714/746 |
| 2009/0282305 A1* | 11/2009 | Chen et al. .................. 714/718 |
| 2011/0007542 A1 | 1/2011 | Lin et al. |
| 2011/0258515 A1 | 10/2011 | Earle et al. |
| 2011/0289349 A1 | 11/2011 | Loeser et al. |
| 2012/0266033 A1* | 10/2012 | Gold et al. .................... 714/718 |

OTHER PUBLICATIONS

Su et al., "An Integrated ECC and Redundancy Repair Scheme for Memory Reliability Enhancement", PowerPoint Presentation, 2005, pp. 1-16.

\* cited by examiner

MEMORY TEST WITH IN-LINE ERROR CORRECTION CODE LOGIC

FIELD OF THE INVENTION

The invention relates to systems and methods for an efficient test of error correction code logic surrounding memories and, more particularly, to systems and methods for reusing existing test structures and techniques used to test memory data to also test the error correction code logic surrounding the memories.

BACKGROUND

Error correction code (ECC) memory is a type of computer data storage that can detect and correct most common kinds of internal data corruption. ECC memory may be used in computers where data corruption cannot be tolerated under any circumstances, such as for scientific or financial computing. Conventionally, ECC is added to memory data contents in order to provide a means for checking the memory data when the memory is read. Typical ECC and related logic allow for single bit errors to be corrected and at least two errors to be detected. Accordingly, ECC memory maintains a memory system effectively free from single bit errors.

The general idea for achieving error detection and correction is to add some redundancy (i.e., some extra data) to a message, which receivers can use to check consistency of the delivered message, and to recover data determined to be corrupted. Error-detection and correction schemes can be either systematic or non-systematic. In a systematic scheme, the transmitter sends the original data, and attaches a fixed number of check bits (or parity data), which are derived from the data bits by some deterministic algorithm. If only error detection is required, a receiver can simply apply the same algorithm to the received data bits and compare its output with the received check bits. If the values do not match, an error has occurred at some point during the transmission (e.g., during the writing and reading process into a memory). In a system that uses a non-systematic code, the original message is transformed into an encoded message that has at least as many bits as the original message.

The ECC logic associated with generating the correct codes or check bits and then decoding the codes or check bits and correcting the data can be difficult to test thoroughly using normal automatic test pattern generation techniques. For example, the ECC logic typically comprises a deep logic tree of XOR gates. The resulting testing coverage of stuck faults and/or defects within the ECC logic can be limited with traditional random test patterns. If defects escape logic testing during manufacturing, the defects may pose a serious risk to quality levels of shipped product in end user systems. Memory data can become corrupted by these defects, or the defects may (at the very least) prevent detection and correction of errors within the memory data.

Furthermore, it may be advantageous to test and repair all memory bits within the ECC logic that are conventionally ignored or bypassed. This results in a high quality memory test. However, in order to improve the shipped product quality level of in-system memory built in self test (BIST) it may be advantageous to test the memories with the ECC logic turned on such that the in-system memory is testing the memories in a similar manner in which the memories would be used in the computing system. Therefore, any minor fails induced by in-system conditions (e.g., noise, power supply irregularities, etc.) may be corrected by the ECC logic and the in-system memory BIST may only report issues (and optionally make repairs) if there are drastic issues that are un-correctable by the ECC logic.

Accordingly, there exists a need in the art to overcome the deficiencies and limitations described hereinabove.

SUMMARY

In a first aspect of the invention, a method is provided for that includes testing a memory of a computing system with an error code correction (ECC) logic block bypassed and a first data pattern applied. The method further includes testing the memory with the ECC logic block enabled and a second data pattern applied. The method also includes testing the memory with the ECC logic block enabled and the first data pattern applied In another aspect of the invention, a method is provided for that includes applying a first signal in a first state. The method further includes applying a second signal in a first state that deactivates an error code correction (ECC) logic block within a computing system. The method further includes testing a memory of the computing system with the ECC logic block deactivated and a first data pattern applied. The method further includes applying the second signal in a second state that activates the ECC logic block. The second signal in the second state is applied while the first signal in the first state is still applied. The method further includes testing the memory with the ECC logic block activated and a second data pattern applied. The method further includes applying the first signal in a second state. The method further includes applying the second signal in the first state. The method further includes testing the memory with the ECC logic block activated and the first data pattern applied.

In yet another aspect of the invention, computing system is provided for that includes at least one memory cell. The computing system further includes an error code correction (ECC) logic block. The computing system further includes a built in self test (BIST) system configured to test the at least one memory cell with the ECC logic block bypassed and a first data pattern applied, test the at least one memory cell with the ECC logic block enabled and a second data pattern applied, and test the at least one memory cell with the ECC logic block enabled and the first data pattern applied.

BRIEF DESCRIPTION OF THE SEVERAL VIEWS OF THE DRAWINGS

The present invention is described in the detailed description, which follows, in reference to the noted plurality of drawings by way of non-limiting examples of exemplary embodiments of the present invention.

DETAILED DESCRIPTION

The invention relates to systems and methods for an efficient test of error correction code logic surrounding memories and, more particularly, to systems and methods for reusing existing test structures and techniques used to test memory data to also test the error correction code logic surrounding the memories. More specifically, implementations of the invention provide systems and methods for the efficient testing of ECC logic surrounding memories (preferably reusing existing test structures and techniques) while still allowing for full test and repairs of memories during manufacturing and relaxed testing that leverages ECC corrections in-system. Advantageously, the performance of the systems and methods provide a test system with enhanced memory reliability and low area overhead by integrating the ECC logic with the BIST.

In embodiments, a three-pass approach may be implemented to both adequately test and repair memories of a computing system and the ECC logic surrounding the memories. This method or system leverages existing memory BIST infrastructure (with minor changes). In embodiments, the testing method or system may test the memory without the ECC logic enabled during manufacturing (e.g., test/repair all memory cells and the BIST sees full data width of memory). The testing method or system may further include testing the memory with the ECC logic enabled during manufacturing using complicated data patterns generated via a linear feedback shift register (used in signature based testing). For example, the BIST examines partial data width (ignores check bits and ensures data propagates through the ECC logic correctly), screens out the ECC logic defects (the ECC logic may be difficult to test via normal data patterns from the BIST typically used to test memory), and improves shipped product quality level due to the resolution of ECC logic issues. Furthermore, the testing method or system may further include testing memory with ECC logic enabled in-system using normal BIST data patterns. For example, the BIST examines partial data width (ignores check bits), adds ECC logic repair margin to a normal BIST run (allows for marginal single cell fails to pass in-system), and improves shipped product quality level.

Test Logic Diagram

Figure 1:
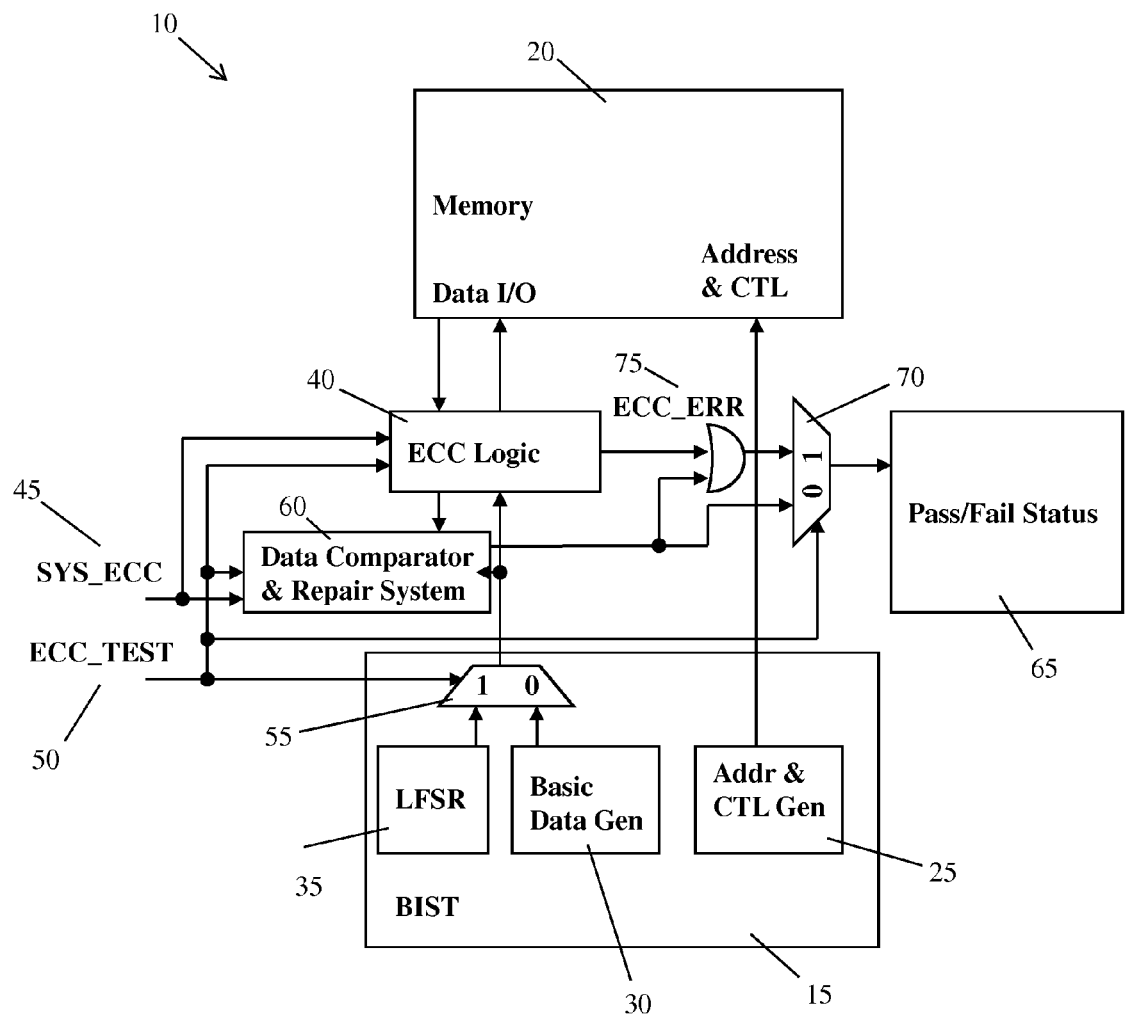
FIG. 1 is an illustrative diagram of a test logic system in accordance with aspects of the invention.

FIG. 1 shows an exemplary diagram of test logic implemented in a computing system 10 in accordance with aspects of the invention. Specifically, FIG. 1 shows a BIST 15 configured to test at least one memory cell 20. In embodiments, the BIST 15 is a mechanism that facilitates the computing system 10 to test itself. For example, electrical or magnetic interference inside the computing system 10 may cause a single bit of the at least one memory cell 20 to spontaneously flip to an opposite state. This opposite state of a single bit may have drastic consequences for the computing system 10 such as leading to either a crash of the computing system 10 or corruption of the memory data written to the at least one memory cell 20. The BIST 15 may be configured to detect the internal data corruption of the at least one memory cell 20.

In embodiments, the at least one memory cell 20 may be a building block of a computer data storage for the computing system 10. The computer data storage may be non-volatile or volatile memory. Examples of computer data storage include a semiconductor or solid-state memory, a random access memory (RAM), a read-only memory (ROM), a dynamic random access memory (DRAM), or a static random access memory (SRAM).

As also shown in FIG. 1, the BIST 15 may comprise an address and control generator 25, a basic data generator 30, and a linear feedback shift register (LFSR) 35. The address and control generator 25 may be configured to address through the at least one memory cell 20 and perform read and write operations within the at least one memory cell 20. The basic data generator 30 may be configured to generate data patterns for use in testing the at least one memory cell 20. The LFSR 35 may be configured to generate data patterns for use in testing ECC logic 40.

The two different data generators (i.e., the basic data generator 30 and the LFSR 35) are configured to provide a statement on the health of the at least one memory cell 20 and the ECC logic 40. For example, prior to shipping the computing system 10 to a customer, at least two testing passes may be performed during manufacture of the computing system 10 to provide a statement on the health of the at least one memory cell 20 and the ECC logic 40.

The first testing pass may comprise inputting a signal 45 (e.g., SYS_ECC signal=0), which indicates a manufacturing test. Specifically, the SYS_ECC signal would be de-asserted (e.g., a low signal) throughout a manufacturing memory test. Additionally, the first testing pass may comprise inputting a signal 50 (e.g., ECC_TEST signal=0). During the first testing pass of the manufacturing memory test, the ECC logic is disabled by de-asserting ECC_TEST to 0. A multiplexer (MUX) 55 selects ECC_TEST signal=0 to activate the basic data generator 30.

The basic data generator 30 and the address and control generator 25 may be configured to control testing to the at least one memory cell 20. Specifically, the basic data generator 30 is configured to generate memory data patterns that are best suited for testing memory (e.g., the at least one memory cell 20), which are typically different from data patterns used to test ECC logic (e.g., the ECC logic 40). The basic data generator 30 outputs the generated data patterns into the MUX 55. The MUX 55 passes the generated data patterns through the ECC logic 40, and directly into the at least one memory cell 20. For example, when the signal 50 is de-asserted or low, the basic data generator 30 is configured to bypass the ECC logic 40 and test the at least one memory cell 20. In other words, the ECC logic 40 is transparent and the data written to the at least one memory cell 20 passes directly through the ECC logic un-modified (since ECC_TEST is de-asserted).

Once the at least one memory cell 20 is read using the generated test pattern from the basic data generator 30, the read memory data is output by the at least one at least memory cell 20 into a data comparator and repair system 60. For example, data read out of the at least one memory cell 20 passes directly through the disabled ECC logic 40 without modification (since ECC_TEST is de-asserted) into the data comparator and repair system 60. The data comparator and repair system 60 is configured to test the read memory data and determine whether the at least one memory cell 20 is functioning properly and/or whether repair of the at least one memory cell 20 is necessary. For example, all of the memory data bits may be compared against expected data (e.g., all bits are compared whenever ECC_TEST is de-asserted). Any mis-compares may cause the data comparator and repair system 60 to attempt to repair the failing at least one memory cell 20, e.g., the data comparator and repair system 60 may use extra/redundant memory blocks in an attempt to repair the failing at least one memory cell 20. If the memory is found to be un-repairable, the status of the at least one memory cell 20 may be captured into a pass/fail status provider 65 for future examination in order to disposition the memory test results. The manufacturing test may fail if the memory is not repairable.

In accordance with aspect of the invention, the data comparator and repair system 60 may be configured to generate a signal indicative of whether the at least one memory cell 20 passed or failed the memory test (e.g., a statement on the health of the at least one memory cell). The pass/fail status provider 65 may be configured to receive the pass/fail signal from the data comparator and repair system 60, and provide the status of the at least one memory cell 20 to a user. For example, when the signal 50 is de-asserted or low, a MUX 70 is configured to select the pass/fail signal from the data comparator and repair system 60, and forward the pass/fail signal to the pass/fail status provider 65.

In embodiments, once the at least one memory cell 20 is determined to be operating correctly, e.g., the memory test is passed, or if the at least one memory cell 20 is found to be repairable, a second testing pass may be selected. The second testing pass may comprise inputting the signal 45 (e.g., SYS_ECC signal=0), which indicates the manufacturing test. Additionally, the second testing pass may comprise inputting the signal 50 (e.g., ECC_TEST signal=1). During the second testing pass of the manufacturing test, the ECC logic is enabled by asserting ECC_TEST to 1 (e.g., a high signal). The MUX 55 selects ECC_TEST signal=1 to activate the LFSR 35. The LFSR 35 is configured to generate complex memory data patterns that are best suited for testing dense logic (e.g., the ECC logic 40), which are typically different from data patterns used to test memory (e.g., the at least one memory cell 20). The LFSR 35 outputs the generated data patterns into the MUX 55, which are passed directly into the ECC logic 40. For example, the data patterns being written to the at least one memory cell 20 from the LFSR 35 may pass through the ECC logic 40, and check bits may be generated and added by the ECC logic 40 in a typical fashion (since ECC_TEST was asserted), as should be understood by those of ordinary skill in the art. Data read out of the at least one memory cell 40 may pass through the ECC logic 40 and be checked against check bit values (since ECC_TEST was asserted) stored within the ECC logic 40.

Since the LFSR 35 and the ECC logic 40 should be generating valid data and storing the data in a working array of the at least one memory cell 20 (the at least one memory cell 20 having been proven in the first testing pass), any mis-compares detected by the ECC logic 40 would indicate failures in the ECC logic 40 itself. The detected mis-compares by the ECC logic 40 may result in a signal 75 (e.g., ECC_ERR) being asserted by the ECC logic 40 and received into the pass/fail status provider 65 through the MUX 70.

In embodiments, the data comparator and repair system 60 may still be used during the second testing pass. However, the data comparator and repair system 60 should be configured to examine the corrected data bits (a data width minus the check bits). Any mis-compare may also result in a fail being stored in the pass/fail provider 65. This may be done in the instance that multiple bits fail in a fashion that is not detectable by typical ECC logic.

In embodiments, a passing memory (e.g., a memory that passes both manufacturing testing passes) may then be integrated into a system. For example, the computing system 10 may be shipped to a customer and integrated into the customer's system. The signal 45 post manufacture is switched high (e.g., SYS_ECC signal=1), which enables the ECC logic 40 for post manufacture in-system testing. Specifically, an in-system test post manufacture would be performed with ECC_TEST de-asserted or low and SYS_ECC asserted or high. SYS_ECC assertion would result in the ECC logic 40 being activated and the data comparator and repair system 60 only working off the corrected data bits (the data width minus the check bits). Since ECC_TEST is de-asserted or low, the BIST 15 would be configured to look for memory cell fails using the basic data generator 30. Any single cell fails would be detected and corrected by the ECC logic 40 automatically. Any multi-cell fails would be detected by the data comparator and repair system 60 and repaired. If repairs were not possible, a fail would be logged in the pass/fail status provider 65, and reported to the customer. Advantageously, the test logic of FIG. 1 provides a test system with enhanced memory reliability and low area overhead by integrating the ECC logic with the BIST.

Flow Diagrams

Figure 2:
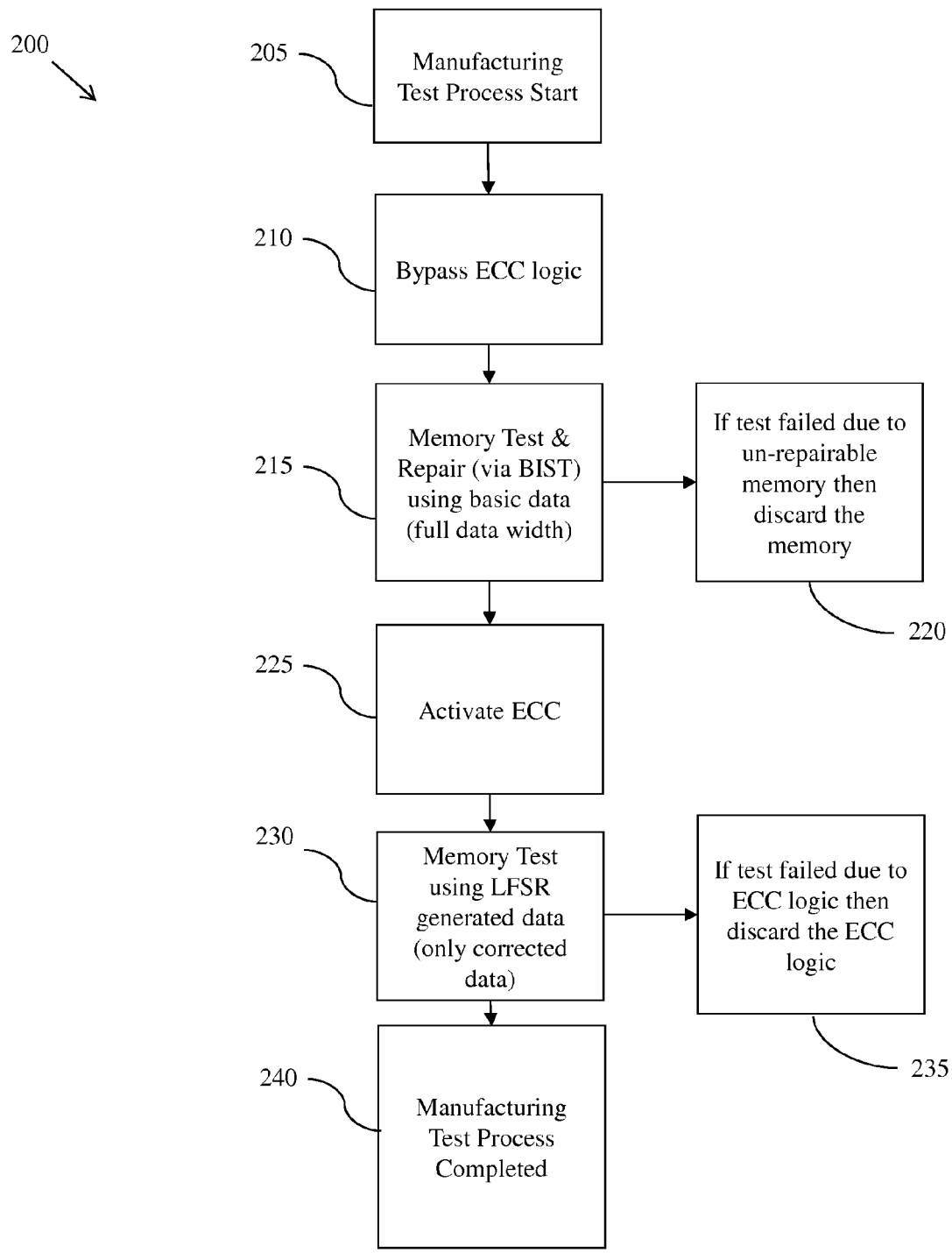
FIGS. 2 and 3 are illustrative process flows for implementing the system in accordance with aspects of the invention.
Figure 3:
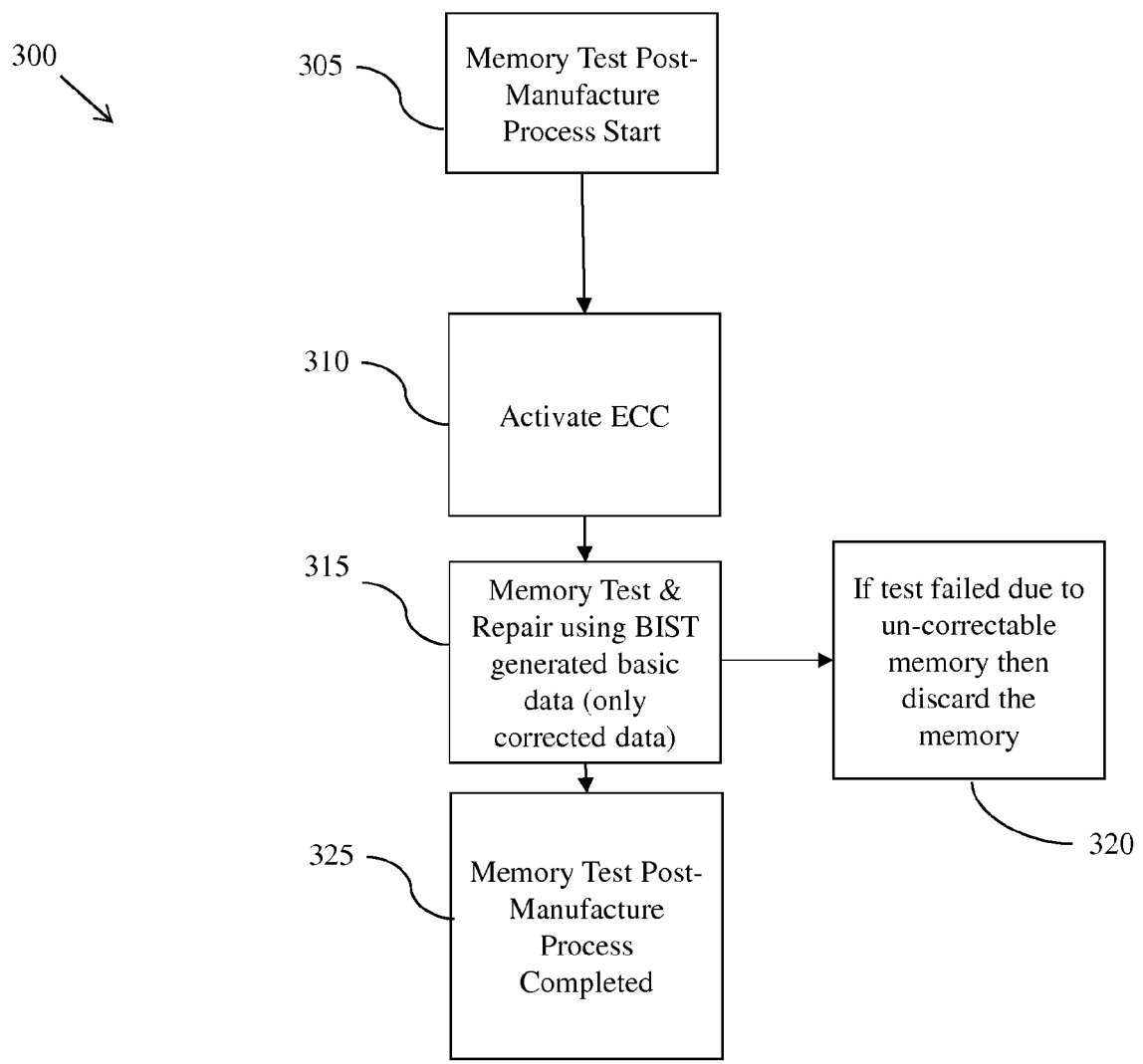

FIGS. 2 and 3 show exemplary flows for performing aspects of the present invention. The steps of FIGS. 2 and 3 may be implemented using the exemplary test logic of FIG. 1, for example.

The flowcharts and/or block diagrams in FIGS. 2 and 3 illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Furthermore, the invention can take the form of a computer program product accessible from a computer-usable or computer-readable medium providing program code for use by or in connection with a computer or any instruction execution system. The software and/or computer program product can be implemented in the exemplary test logic of FIG. 1. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable storage medium include a semiconductor or solid-state memory, magnetic tape, a removable computer diskette, a random access memory (RAM), a read-only memory (ROM), a rigid magnetic disk and an optical disk. Current examples of optical disks include compact disk-read only memory (CD-ROM), compact disc-read/write (CD-R/W) and DVD.

In embodiments, as shown in FIG. 2, a process 200 is provided for testing memory and ECC logic of a product (e.g., a computing system) during manufacture. For example, prior to shipping a product comprising memory and ECC logic to a customer, at least two testing passes may be performed during manufacture of the product to provide a statement on the health of the memory and the ECC logic configured to check the memory data when the memory is read.

At step 205, the manufacturing test process starts. The manufacturing test process may be initiated by inputting a first signal in a first state (e.g., SYS_ECC signal in a de-asserted or low state, as discussed with respect to FIG. 1) into the product. For example, the first signal in the first state may activate a manufacturing test. At step 210, an ECC logic block of the product may be configured to be disabled or bypassed. The bypass of the ECC logic block may comprise inputting a second signal in a first state (e.g., ECC_TEST in a de-asserted or low state, as discussed with respect to FIG. 1). For example, the second signal in the first state may activate a first path of the manufacturing test in-system in which the ECC logic block is disabled or bypassed.

At step 215, testing and repair of memory within the product may be performed. For example, testing and repair of the memory may comprise generating a first set of data patterns and writing the first set of data patterns into the memory (e.g., a first portion of a BIST may generate and write the first set of data patterns into a memory). The first set of data patterns may be designed for testing memory. Since the second signal is input in the first state, the ECC logic block is disabled or bypassed, and the first set of data patterns are written to the memory un-modified by the ECC logic block. Additionally, testing and repair of the memory may comprise reading the first set of data patterns from the memory to generate read memory data. The read memory data may be output by the memory directly into a data comparator and repair system. For example, the read memory data may pass directly through the disabled ECC logic block without modification into the data comparator and repair system.

In embodiments, the testing and repair of the memory may further comprise determining whether the read memory data is correct. For example, all of the read memory data bits or basic data (e.g., the full data width) may be compared against expected data stored in the data comparator and repair system. Any mis-compares may trigger repair of the failing memory, e.g., the data comparator and repair system may be configured to use extra/redundant memory blocks in an attempt to repair the failing memory.

At step 220, if the memory is found to be un-repairable, the status of the memory may be captured for future examination in order to disposition the memory test results. The manufacturing test may fail if the memory is not repairable and the memory may be discarded.

At step 225, if the memory is determined to be operating correctly, e.g., the memory test is passed, or if the memory is found to be repairable, the ECC logic block may be activated. The ECC logic block activation may comprise inputting the second signal in a second state (e.g., ECC_TEST in an asserted or high state, as discussed with respect to FIG. 1). For example, the second signal in the second state may activate a second path of the manufacturing test in-system in which the ECC logic block is activated.

At step 230, the memory may be tested again in the second testing path. For example, the second testing of the memory may comprise generating a second set of data patterns and writing the second set of data patterns into the memory (e.g., a second portion of a BIST may generate and write the second set of data patterns into a memory). The second set of data patterns may be designed for testing dense logic such as ECC logic. Since the second signal is input in the second state, the ECC logic block is activated, and the second set of data patterns are written to the memory modified by the ECC logic block, e.g., the ECC logic block may add check bits to the second set of data patterns. Additionally, the second testing of the memory may comprise reading the second set of data patterns from the memory to generate read memory data. The read memory data may be output by the memory directly into the ECC logic block. For example, the read memory data may pass directly into the activated ECC logic block with the previously added modifications included within the read memory data.

In embodiments, the second testing of the memory may further comprise determining whether the added modifications are read correctly. For example, the added check bits may be compared against check bit values stored in the ECC logic block. Since the second data pattern and added modifications should be written in a working array of the memory (the memory having been proven to be functioning correctly in the first testing pass), any mis-compares detected by the ECC logic block would indicate failures in the ECC logic block. Any mis-compares may trigger discarding of the ECC logic at step 235.

At step 240, if the memory is determined to be operating correctly, e.g., the memory test is passed, or if the memory is found to be repairable, and the ECC logic block is determined to be operating correctly, then the manufacturing test process is completed. For example, a passing memory (a memory that passes both manufacturing testing passes) may then be integrated into a system. Advantageously, process 200 provides a testing process that yields enhanced memory reliability.

In embodiments, as shown in FIG. 3, a process 300 is provided for testing memory of a product (e.g., a computing system) after manufacture. For example, once a memory has been integrated into a customer's system, testing may be performed of the product to provide a statement on the health of the memory or repair of the memory.

At step 305, a memory test post-manufacture starts. The test process may be initiated by inputting the first signal in a second state (e.g., SYS_ECC signal in an asserted or high state, as discussed with respect to FIG. 1) into the product. At step 310, the ECC logic block may be activated. The ECC logic block activation may comprise receiving the first signal in the second state at the ECC logic block (e.g., SYS_ECC signal in an asserted or high state, as discussed with respect to FIG. 1). For example, the first signal in the second state may activate the ECC logic block.

At step 315, testing and repair of memory within the product may be performed. For example, testing and repair of the memory may comprise inputting and receiving a second signal in a first state (e.g., ECC_TEST signal in a de-asserted or low state, as discussed with respect to FIG. 1). For example, the second signal in the first state may activate an in-system test path post-manufacture in which the ECC logic block is activated.

In embodiments, the testing and repair of the memory may further comprise generating a first set of data patterns and writing the first set of data patterns into the memory (e.g., the first portion of the BIST may generate and write the first set of data patterns into the memory). The first set of data patterns may be designed for testing memory. Since the second signal is input in the first state and the ECC logic block is activated, the first set of data patterns are written to the memory modified by the ECC logic block, e.g., the ECC logic block may add check bits to the first set of data patterns. Additionally, the testing and repair of the memory may comprise reading the first set of data patterns from the memory to generate read memory data. The read memory data may be output by the memory directly into the ECC logic block. For example, the read memory data may pass directly into the activated ECC logic block with the previously added modifications included within the read memory data.

Specifically in embodiments, the in-system test and repair process post manufacture may be performed with the first signal asserted or high and the second signal de-asserted or low. The first signal assertion would result in the ECC logic block being activated and the data comparator and repair system only working off the corrected data bits (the data width minus the check bits). Since the second signal is de-asserted or low, the in-system test and repair process would comprise looking for memory cell fails using the first test pattern. Any single cell fails would be corrected by the ECC logic block automatically. Any multi-cell fails would be detected by the data comparator and repair system and repaired. At step 320, if repairs were not possible due to uncorrectable memory, a fail would be logged, and reported to the customer such that the memory may be discarded.

At step 325, if the memory is determined to be operating correctly, e.g., the memory test is passed, or if the memory is found to be repairable, then the test process is completed. Advantageously, process 300 provides a testing process that yields enhanced memory reliability.

The systems and methods as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprising:
   applying a first signal in a first state;
   applying a second signal in a first state that is configured to bypass an error code correction (ECC) logic block;
   generating a first data pattern using a basic data generator;
   writing the first data pattern to a memory of a computing system unmodified;
   generating read memory data from a reading of the first data pattern;
   testing the memory with the error code correction (ECC) logic block bypassed and the first data pattern applied, wherein the read memory data is passed through the ECC logic block without modification into a data comparator and repair system, and the read memory data is compared against expected data stored in the data comparator and repair system;
   applying the second signal in a second state that is configured to activate the ECC logic block, wherein the second signal in the second state is applied while the first signal in the first state is still applied;
   generating a second data pattern using a linear feedback shift register, wherein the second data pattern is generated based on a determination that the memory is operating correctly or is found to be in a repairable state;
   writing the second data pattern to the memory, wherein modifications are added to the second data pattern by the ECC logic block;
   generating second read memory data from a reading of the second data pattern;
   testing the memory with the ECC logic block enabled and the second data pattern applied, wherein the second read memory data is passed into the ECC logic block with the added modifications;
   applying the first signal in a second state that is configured to enable the ECC logic block for post manufacture in-system testing;
   applying the second signal in the first state; and
   testing the memory with the ECC logic block enabled and the first data pattern applied.

2. The method of claim 1, wherein the testing the memory with the ECC logic block bypassed and the testing the memory with the ECC logic block enabled and the second data pattern applied are performed during manufacture of the computing system.

3. The method of claim 2, wherein the testing the memory with the ECC logic block enabled and the first data pattern applied is performed post-manufacture of the computing system.

4. The method of claim 3, wherein the first data pattern is designed for testing the memory.

5. The method of claim 4, wherein the second data pattern is designed for testing a dense logic of the ECC logic block and the first data pattern is different from the second data pattern.

6. The method of claim 1, wherein any mis-compares between all of the read memory data bits and the expected data trigger repair of the memory.

7. The method of claim 6, wherein:
   the testing the memory with the ECC logic block enabled and the second data pattern applied comprises:
   comparing modifications added to the second data pattern against expected values; and
   any mis-compares between the modifications and the expected values indicate a failure in the ECC logic block.

8. The method of claim 7, wherein the modifications are check bits and the expected values are expected values for the check bits.

9. The method of claim 8, wherein:
   testing the memory with the ECC logic block enabled and the first data pattern applied comprises:
   adding the modifications to the first data pattern using the ECC logic block;
   writing the first data pattern with the modifications to the memory;
   reading the first data pattern with the modifications from the memory to generate third read memory data bits and the modifications; and
   comparing the modifications against the expected values; and
   any mis-compares between the modifications and the expected values indicate a failure, wherein a single cell failure within the memory is corrected by the ECC logic block, and a multiple cell failure within the memory is corrected by the data comparator and repair system.

10. A method comprising:
    applying a first signal in a first state;
    applying a second signal in a first state that is configured to deactivate an error code correction (ECC) logic block within a computing system and activate a first portion of a built in self test (BIST);
    generating a first data pattern using the first portion of the BIST;
    writing the first data pattern to a memory of the computing system unmodified;

generating read memory data from a reading of the first data pattern;

testing the memory of the computing system with the ECC logic block deactivated and the first data pattern applied, wherein the read memory data is passed through the ECC logic block without modification into a data comparator and repair system, and the read memory data is compared against expected data stored in the data comparator and repair system;

applying the second signal in a second state that is configured to activate the ECC logic block and activate a second portion of the BIST, wherein the second signal in the second state is applied while the first signal in the first state is still applied;

generating a second data pattern using the second portion of the BIST, wherein the second data pattern is generated based on a determination that the memory is operating correctly or is found to be in a repairable state;

writing the second data pattern to the memory, wherein modifications are added to the second data pattern by the ECC logic block;

generating second read memory data from a reading of the second data pattern;

testing the memory with the ECC logic block activated and the second data pattern applied, wherein the second read memory data is passed into the ECC logic block with the added modifications;

applying the first signal in a second state that is configured to enable the ECC logic block for post manufacture in-system testing;

applying the second signal in the first state; and testing the memory with the ECC logic block activated and the first data pattern applied.

11. The method of claim 10, wherein the testing the memory with the ECC logic block deactivated and the testing the memory with the ECC logic block activated and the second data pattern applied are performed during manufacture of the computing system.

12. The method of claim 11, wherein the applying the first signal in the second state occurs after the manufacture of the computing system.

13. The method of claim 12, wherein the testing the memory with the ECC logic block activated and the first data pattern applied is performed after the manufacture of the computing system.

14. The method of claim 13, wherein the first data pattern is designed for testing the memory.

15. The method of claim 14, wherein the second data pattern is designed for testing the ECC logic block.

16. A computing system comprising:
at least one memory cell;
an error code correction (ECC) logic block; and
a built in self test (BIST) system comprising:
a basic data generator configured to generate a first data pattern; and
a linear feedback shift register configured to generate a second data pattern,
wherein the BIST is configured to:
test the at least one memory cell with the ECC logic block bypassed as a result of a second signal being applied in a first state that is configured to bypass the FCC logic block and the first data pattern applied, wherein the second data pattern is generated based on a determination that the at least one memory cell is operating correctly or is found to be in a repairable state;
test the at least one memory cell with the ECC logic block enabled as a result of the second signal being applied in a second state that is configured to enable the ECC logic block and the second data pattern applied, wherein the second signal in the second state is applied while a first signal in a first state is applied; and
test the at least one memory cell with the ECC logic block enabled as a result of the first signal being applied in a second state that is configured to enable the ECC logic block for post manufacture in-system testing and the second signal being applied in the first state, and the first data pattern applied.

17. The computing system of claim 16, wherein the testing the memory with the ECC logic block bypassed and the testing the memory with the ECC logic block enabled and the second data pattern applied are performed during manufacture of the computing system.

18. The computing system of claim 17, wherein the testing the memory with the ECC logic block enabled and the first data pattern applied is performed post-manufacture of the computing system.

19. The computing system of claim 18, wherein the first data pattern is designed for testing the memory.

20. The computing system of claim 19, wherein the second data pattern is designed for testing the ECC logic block.

* * * * *